United States Patent [19]
Kane et al.

[11] Patent Number: 5,763,906
[45] Date of Patent: Jun. 9, 1998

[54] MID INFRARED LIGHT EMITTING DIODE

[75] Inventors: Michael John Kane; David Lee; David Robert Wight; John Michael Boud, all of Malvern, Great Britain

[73] Assignee: The Secretary of State for Defence in Her Britannic Majesty's Government of the United Kingdom of Great Britian and Northern Ireland, Hants, United Kingdom

[21] Appl. No.: 776,531
[22] PCT Filed: Jul. 17, 1995
[86] PCT No.: PCT/GB95/01679
  § 371 Date: Mar. 13, 1997
  § 102(e) Date: Mar. 13, 1997
[87] PCT Pub. No.: WO96/04686
  PCT Pub. Date: Feb. 15, 1996

[30] Foreign Application Priority Data
  Aug. 1, 1994 [GB] United Kingdom ............. 9415528
[51] Int. Cl.$^6$ .............................................. H01L 33/00
[52] U.S. Cl. ............................ 257/79; 257/103; 438/22; 438/45
[58] Field of Search ................... 257/103, 79, 86, 257/94; 438/22, 45

[56] References Cited

U.S. PATENT DOCUMENTS

| 3,930,161 | 12/1975 | Ameurlaine et al. ............. 250/370 |
| 4,008,485 | 2/1977 | Miyoshi et al. . |
| 4,144,540 | 3/1979 | Bottka . |

FOREIGN PATENT DOCUMENTS

| 0260110A2 | 9/1987 | European Pat. Off. . |
| 1398006 | 12/1972 | United Kingdom . |
| WO82/00921 | 3/1982 | WIPO . |

OTHER PUBLICATIONS

Physical Review, vol. 123, No. 5, 1 Sep. 1961 New York U.S., pp. 1560–1566, J.R. Dixon & J.M. Ellis, "Optical properties of n-type indium arsenide in the fundamental absorption edge region".

*Primary Examiner*—Jerome Jackson
*Assistant Examiner*—Nathan K. Kelley
*Attorney, Agent, or Firm*—Nixon & Vanderhye P.C.

[57] ABSTRACT

A mid-infrared emitting diode with a substrate which is transparent to radiation produced by the device by virtue of the Moss-Burstein shift which is induced in the substrate by heavy doping. Emission from the device takes place via said substrate with a significant increase in external efficiency due to avoidance of obscuration by metallic contact.

22 Claims, 5 Drawing Sheets

MID INFRARED LIGHT EMITTING DIODE

BACKGROUND OF THE INVENTION

1. Field of the Invention

The current invention is concerned with devices for producing radiation in the mid infrared region of the electromagnetic spectrum and has particular (though not exclusive) relevance to the problem of gas sensing.

2. Discussion of Prior Art

Light emitting diodes (LEDs) have been studied for a number of years, primarily for the purposes of displays and communications (see for example A A Bergh and P J Dean "Light Emitting Diodes", Clarendon Press Oxford 1976). Technologies based on GaAs, GaP and InP and alloys grown as thin layers on these materials (eg $Al_xGa_{1-x}As$ grown on GaAs) are well developed and provide devices producing radiation of wavelengths from $0.5 \times 10^{-6}$ m to $1.7 \times 10^{-6}$ m.

U.S. Pat. No. 4,144,540 discloses an infrared detector composed of four layers of epitaxially grown material that is doped for selective wavelength absorption. The device has a narrow band, tuneable response. The upper layers comprise a heavily doped n type layer over a p type layer. The cut-on absorption edge is determined by the amount of doping in the uppermost layer and the cut off absorption edge can be varied by applying a reverse bias voltage to the n-p junction formed by these layers.

The "Encyclopedia Of Semiconductor Technology" (Encyclopedia Reprint Series), ed. by Martin Grayson, John Wiley & Sons, New York, US, teaches the optimisation of the amount of generated radiation that can be emitted from a LED. Although this document refers to the use of the Moss-Burstein shift to render the substrate of a LED transparent to radiation produced therein, the reference is made in relation to GaAs devices in which the key physical mechanism of operation is, in fact, that the radiation generated in the p type material has energies below the bandgap of the material. Using n-type material to extract the radiation is advantageous because it eliminates the very strong free carrier absorption associated with p type material. The Moss Burstein shift in GaAs is small and it is unlikely that the effect would be of significant use in these devices.

Historically, requirements for LEDs with operating wavelengths of longer than $1.55 \times 10^{-6}$ m have been much more limited and consequently such devices have been the subject of much less development activity.

There is currently a growing interest in the development of cheap, quantitative, selective and low power gas detection apparatus. Many gases have vibration-rotation absorption bands in the wavelength range $[2$ to $5] \times 10^{-6}$ m which provide a characteristic signature of that gas. An optical system based on an LED operating at the characteristic absorption wavelength has the potential to meet these system requirements. Moreover, such an LED based system would be more power efficient than the alternative system based on a thermal infrared source.

Gases of particular interest include methane with an absorption at $3.3 \times 10^{-6}$ m, carbon dioxide with an absorption at $4.2 \times 10^{-6}$ m and carbon monoxide with an absorption at $4.7 \times 10^{-6}$ m.

In a conventional LED structure, an evaporated metal contact is applied to the top surface of a layer structure which includes a p-n junction. This contact can obscure a significant portion of the emitting area of the LED and hence lead to a reduction in external efficiency. Moreover, in thin layers of material, current crowding is likely to occur, that is the vertical current through the contact layer is largely constrained to flow in the area of the device under the top contact (see W B Joyce and S H Wemple, Journal of Applied Physics, 41, 3818 (1970)). This further reduces the light output from the top surface of the device. This effect is particularly severe in devices fabricated with p-type upper contact layers due to the low mobility of holes in III/V semiconductors.

In GaAs/AlGaAs IR LEDs these problems of light extraction have been met by inverting the device structure and extracting the light from the substrate side. It is necessary to either etch a window in the substrate to produce a Burrus structure (C A Burrus and B I Miller, Optical Communications, 4, 307 (1971)) or to grow the device on a wider band-gap substrate which is substantially transparent at the operating wavelength of the device.

Both of these approaches lead to difficulties in device fabrication: the former introduces additional process steps together with associated problems of etch depth control (possibly requiring the growth of additional etch-stop layers) and can lead to increased access resistance and device heating; in the latter, it is necessary to find suitable lattice matched wide gap substrate materials, necessitating the use of ternary or quaternary alloys which are frequently difficult to obtain.

The above problems are equally relevant to the fabrication of devices for operation in the mid infrared region.

SUMMARY OF THE INVENTION

According to this invention, a light emitting diode for producing radiation in the wavelength range $2.5 \times 10^{-6}$ to $5 \times 10^{-6}$ m comprises multiple layers of InAs including a substrate of n-type InAs, a layer of n-type InAs located on said substrate and a layer of p-type InAs, characterised in that the substrate is transparent to radiation produced by the diode by virtue of a Moss-Burstein shift induced by suitable doping of the substrate material.

In a preferred embodiment the substrate material is doped to within the range $10^{18}$ cm to $5 \times 10^{18}$ cm$^{-3}$.

In a further preferred embodiment the substrate material is doped to within the range $3 \times 10^{18}$ cm$^{-3}$ to $5 \times 10^{18}$ cm$^{-3}$.

Preferably the layer of n-type InAs is doped to a level of $5 \times 10^{17}$ cm$^{-3}$ and the layer of p-type InAs is doped to a level of $5 \times 10^{18}$ cm$^{-3}$.

In a further preferred embodiment the layer of n-type InAs is doped to a level of $10^{18}$ cm$^{-3}$ the layer of p-type InAs is doped to a level of $5 \times 10^{18}$ cm$^{-3}$ and further comprising a layer of undoped InAs. The transparent substrate may be formed into a lens.

InAs LEDs, with p-type contact layers doped at $5 \times 10^{18}$ cm$^{-3}$, have been fabricated on n-type substrates with a doping level of $10^{16}$ cm$^{-3}$. Such a device has an emission spectrum with a peak of $3.44 \times 10^{-6}$ m (corresponding to an energy, E=0.36eV) and a Full Width Half Maximum (FWHM) of $0.4 \times 10^{-6}$ m (E=0.04eV). The substrate is transparent only to light in the tail of the emission spectra (wavelength>$3.7 \times 10^{-6}$ m, E<0.335eV), and light from this region has been imaged using a mechanical raster scan. The resulting images have shown that, as a result of current crowding, nearly all optical emission takes place under the contact metalisation.

A mid infrared device similar to the above, in which the substrate is transparent over the whole spectrum of light generated in the active region, will facilitate extraction of much more light.

By the current invention the substrate of an InAs, mid-infrared emitting, device is rendered transparent using the Moss-Burstein shift (E Burstein, Phys. Rev., 93 104 (1954); T S Moss, Proc.Phys. Soc. 1367 775 (1954)). This allows growth of active layers used to generate the light on a transparent substrate which is not chemically different in composition.

When a semiconductor is heavily doped with an n-type dopant there exists a critical doping density above which, in terms of conductivity, the material behaves like a metal. The Fermi energy ($E_f$) is shifted to within the conduction band so that the probability of occupation by electrons of some states within the conduction band is significant. Under these conditions (for radiation within specific wavelength ranges) optical absorption is suppressed and the material is rendered substantially transparent.

The magnitude of the Moss Burstein shift E (defined as the energy where the absorption coefficient drops to half its value in undoped material) is given by the expression:

$$E = E_f(1 + m_e/m_h) \tag{1}$$

where $m_e$ and $m_h$ are the electron and hole effective masses and $E_f$ at a given doping density is given approximately by the implicit equation:

$$\frac{1}{3\pi^2} \left( \frac{8\pi^2 E_f m(E_f)}{h^2} \right)^{\frac{3}{2}} = n \tag{2}$$

where n is the doping density and m(E) is the energy dependent mass of electrons in the conduction band which is given by $$\frac{m(E)}{m(G)} = \left(1 + \frac{E}{E_G}\right)\left(1 + \frac{E}{E_G + \Delta}\right) \frac{\left(E_G + \frac{2}{3}\Delta\right)}{\left(E + E_G + \frac{2}{3}\Delta\right)} \tag{3}$$

where $E_G$ is the bandgap of the semiconductor and $\Delta$ is the spin-orbit splitting in the valence band. (See N W Ashcroft and D Mermin "Solid State Physics" Saunders College Philadelphia 1976) pp 36–37 and G Bastard, Acta Electronica 25 147 (1983) for the derivation of equations (2) and (3) respectively).

The size of the Moss-Burstein shift is approximately inversely proportional to the band gap for a III–V semiconductor (for a given doping density). The bandgap of InAs is one quarter that of GaAs and the Moss-Burstein shift is therefore four times larger. The definition of substrate transparency is taken to be an absorption coefficient of 100 cm$^{-1}$, corresponding to an absorption length of 100×10$^{-6}$ m. Optical measurements have shown that, in InAs, the energy where the absorption coefficient has this value is increased from 0.34eV (3.64×10$^{-6}$ m) in nominally undoped material to 0.48eV (2.3×10$^{-6}$ m) with a doping density of 3.8×10$^{18}$ cm$^{-3}$ (J R Dixon & J M Ellis, Phys. Rev., 123, 1560 (1961)). This shift in absorption renders the substrate substantially transparent to the radiation emitted by low doped InAs whose characteristic spectrum is described above.

BRIEF DESCRIPTION OF DRAWINGS

The invention will now be described, by example, with reference to the following figures in which.

DETAILED DISCUSSION OF PREFERRED EMBODIMENTS

Figure 1:
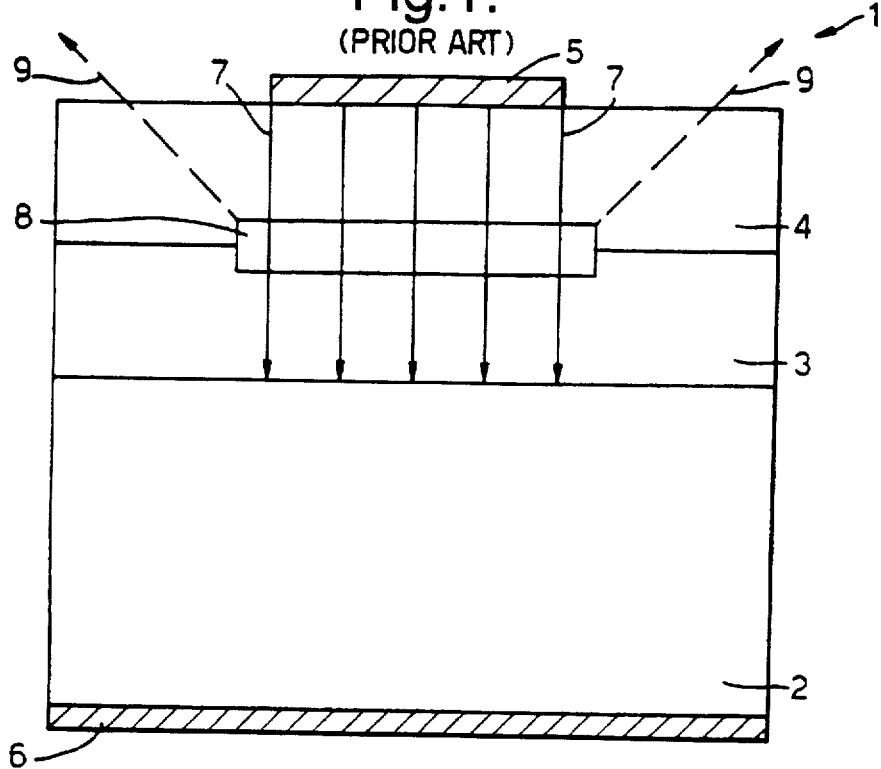
FIG. 1 represents a typical light emitting diode of the prior art.

Referring to FIG. 1, a typical LED 1 of the prior art includes an opaque substrate layer 2 of p-type material, a layer of p-type material 3 and a layer of n-type material 4. An evaporated metal contact 5 is applied to the top of the device and a second contact 6 is applied to the substrate 2.

During operation, a potential difference is applied between contacts 5 and 6 and the vertical current (as represented by arrows 7) through the device is largely constrained to flow under the contact 5. Consequently the active region 8 of the device is restricted to that area of the junction between layers 3 and 4 which is directly below contact 5. The emission of light (as represented by the broken arrows 9) from such a device is restricted by the opaque substrate 2 and the metal contact 5.

Figure 2:
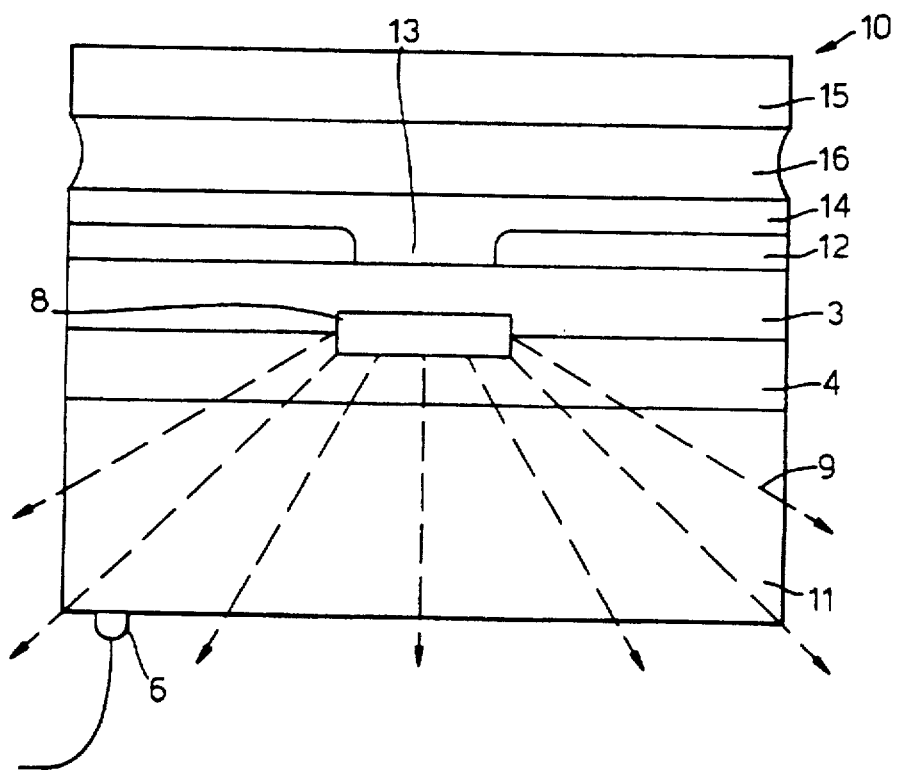
FIG. 2 represents a proposed structure which is typical of the current invention.

Referring to FIG. 2, a typical device of the invention 10 utilizes a highly doped n-type substrate 11 to provide an exit path which is transparent to the radiation produced by the device. A n-type layer 4 is grown on the substrate and a thin p-type contact layer 3 is grown uppermost. The p-type contact layer 3 is coated with an insulating layer 12 in which a window 13 is opened to define an area of contact between p-type contact layer 3 and metallic layer 14. Since the metallic layer 14 is extended over the surface of the insulating layer 12, the contact area between layers 3 and 14 can be made as small as lithography will allow without introducing bonding problems. Individual devices may be bonded to a suitable header 15 using a suitable conducting medium 16 such as conductive epoxy resin.

Electrical contact is made to the n-type substrate 11 by means of a suitable metallic contact 6, applied remotely from the emitting area of the device. The high electronic mobility in the material of the substrate 11 together with the proximity of the active region to the p-type contact 3 prevents current crowding in the substrate 11 being significant in this geometry.

During operation, a potential difference is applied between header 15 and contact 6 and current flows through the device. Light (as represented by arrows 9) is produced at the active region 8 of the device and may exit the device through substrate 11. The active region 8 is restricted, by current crowding in layer 3, to that area of the junction between layers 3 and 4 which is directly below window 13.

Figure 3:
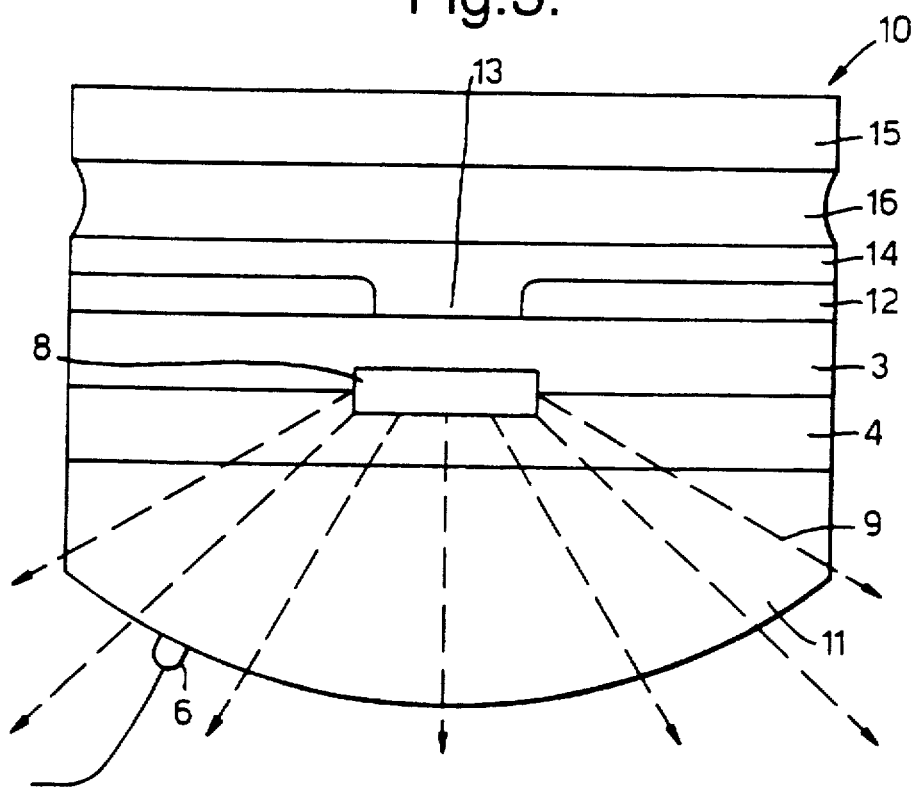
FIG. 3 represents a preferred structure of the current invention.

The external efficiency of the device represented by FIG. 2 is limited by internal reflection at the interface between substrate 11 and air. Referring to FIG. 3 the external efficiency of the device is improved by forming the substrate 11 into a hemispherical or parabolical lens. This may be achieved by standard polishing or etching techniques well known to those skilled in the art. Alternatively, a lens may be attached to a flat substrate.

Figure 4A:
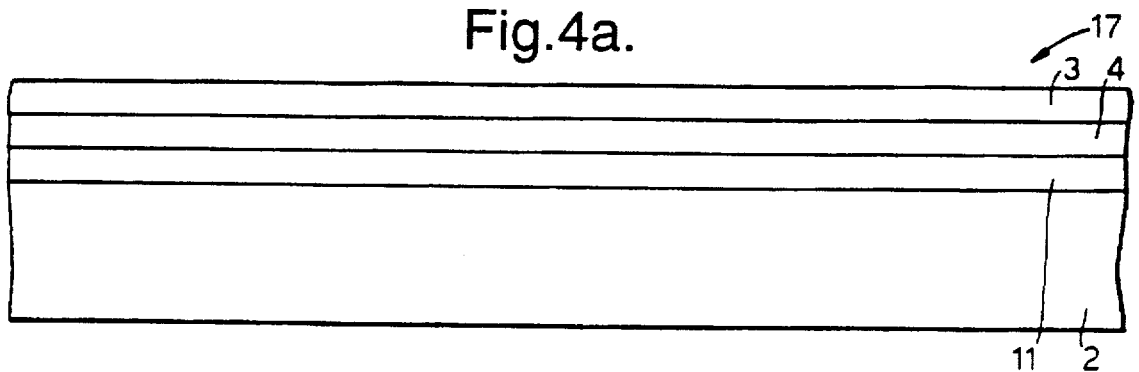
FIG. 4a represents a layer structure used to form an actual embodiment of the current invention, FIG. 4b the actual embodiment so formed, FIG. 4c a device similar to that found in the prior art, formed for comparison purposes.

Referring to FIG. 4a, a starting layer structure 17 was formed comprising a $300 \times 10^{-6}$ m thick n-type substrate 2 of InAs doped to $5 \times 10^{16}$ cm$^{-3}$, a $10 \times 10^{-6}$ m layer of n-type InAs 11 doped to $4 \times 10^{18}$ cm$^{-3}$, a $2 \times 10^{-6}$ m layer of n-type InAs 4 doped to $5 \times 10^{17}$ cm$^{-3}$ and a $2 \times 10^{-6}$ m layer of p-type InAs 3 doped to $5 \times 10^{18}$ cm$^{-3}$. In this example, layers 3, 4 and 11 were deposited by Metal Organic Chemical Vapour Deposition but other suitable techniques, for example Molecular Beam Epitaxy, will be apparent to those skilled in the art.

Also, a number of possible dopants are known. In this case sulphur was used as the n-type dopant and zinc was used as the p-type dopant.

Figure 4B:
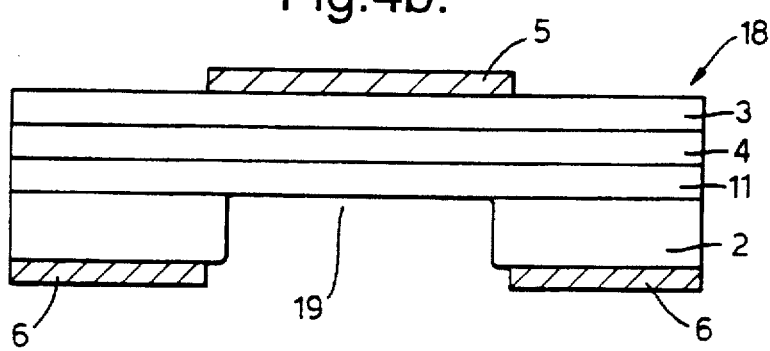

Referring to FIG. 4b, in order to fabricate a device of the current invention 18, a sample of the starting layer structure represented by FIG. 4a was taken and the lower substrate layer 2 was first thinned to a thickness of $100 \times 10^{-6}$ m. A $100 \times 10^{-6}$ m square 5 of Au/Ti contact metalisation was deposited on top of the layer structure and a metal contact 6 of NiGeAu was deposited on the bottom of the substrate 2. This lower contact 6 contained a hole 19 centred on, and slightly larger than, the top contact 5. The substrate layer 2, which is opaque to radiation produced by the device, was etched under the top contact 5 to expose the heavily doped substrate layer 11, which is transparent to radiation produced by the device.

Figure 4C:
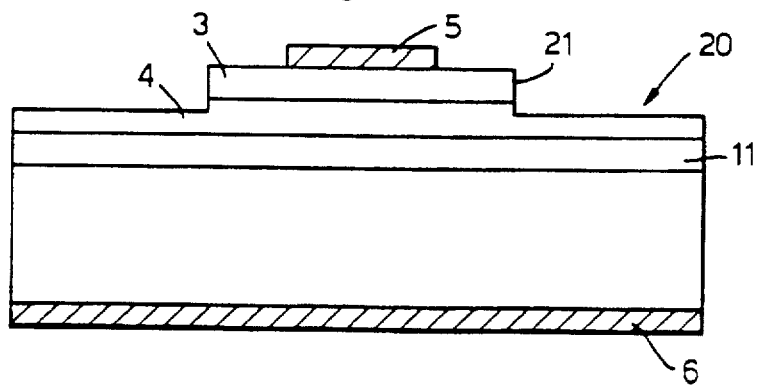

Referring to FIG. 4c, a front emission device 20 similar to that found in the prior art was fabricated, for comparison purposes, from the same basic layer structure represented by FIG. 4a. The device was fabricated by depositing a $50 \times 10^{-6}$ m diameter TiAu contact 5 on top of the layer structure and etching a $\sim 3 \times 10^{-6}$ m mesa 21 around the top contact. A metal contact 6 of NiGeAu was deposited on the bottom of the substrate.

Figure 5:
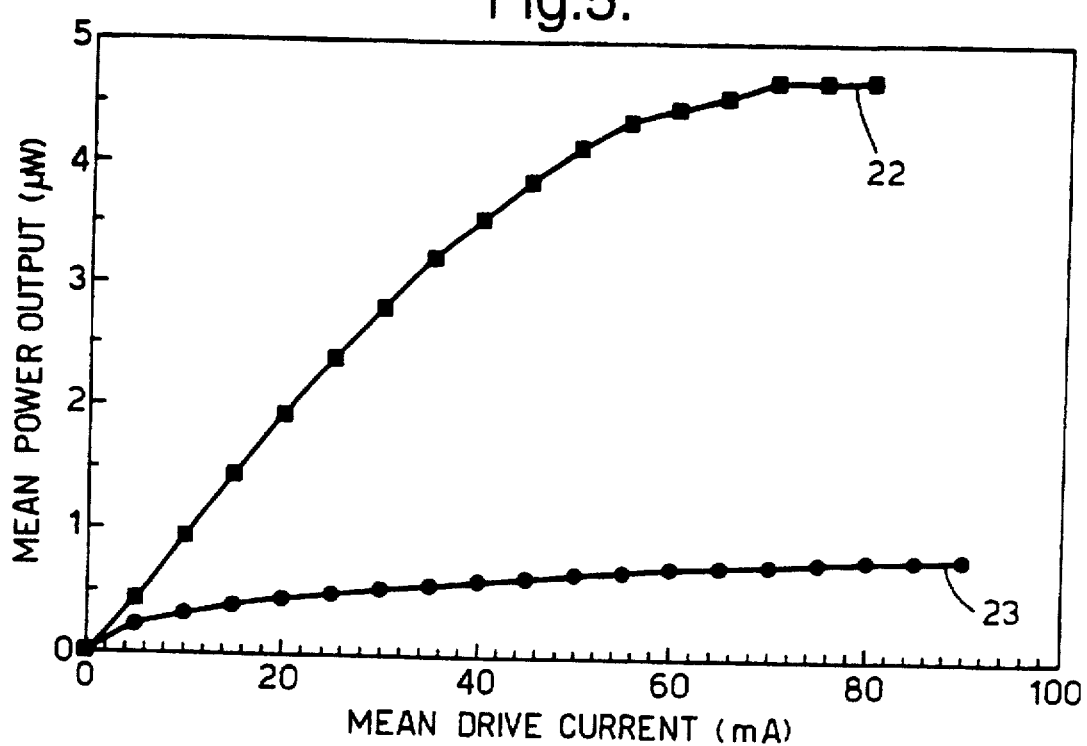
FIG. 5 shows a comparison between the plots of output intensity versus drive current for the devices represented by FIGS. 4b and 4c.

Referring to FIG. 5, comparison of the plots of output intensity versus drive current for the device of the current invention 22 (as represented in FIG. 4b) and of the prior art 23 (as represented in FIG. 4c) show that, for a given drive current, the mean power output is typically about five times greater for the device of the current invention.

Figure 6A:
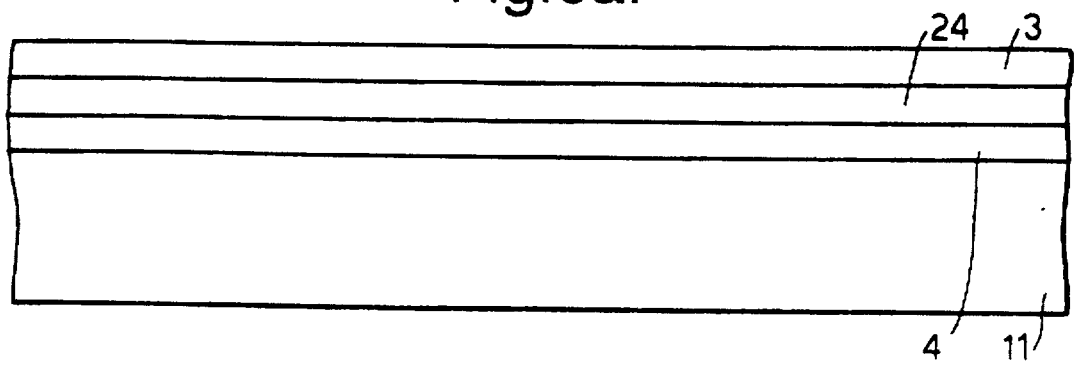
FIG. 6a represents a layer structure used to form a second embodiment of the current invention, FIG. 6b the actual embodiment so formed FIG. 6c a device similar to that found in the prior art, formed for comparison purposes

Referring to FIG. 6a, a second embodiment of the invention was fabricated from a layer structure (grown by molecular beam epitaxy) on a substrate of n-type InAs 11 rendered transparent in the wavelength range of interest by doping to $2 \times 10^{18}$ cm$^{-3}$. The structure comprised a $10^{-6}$ m layer of n-type InAs 4 doped to a level of $10^{18}$ cm, a $2 \times 10^{-6}$ m layer of undoped InAs 24 and a $2 \times 10^{-6}$ m layer of p-type InAs 3 doped to a level of $5 \times 10^{18}$ cm$^{-3}$.

Figure 6B:
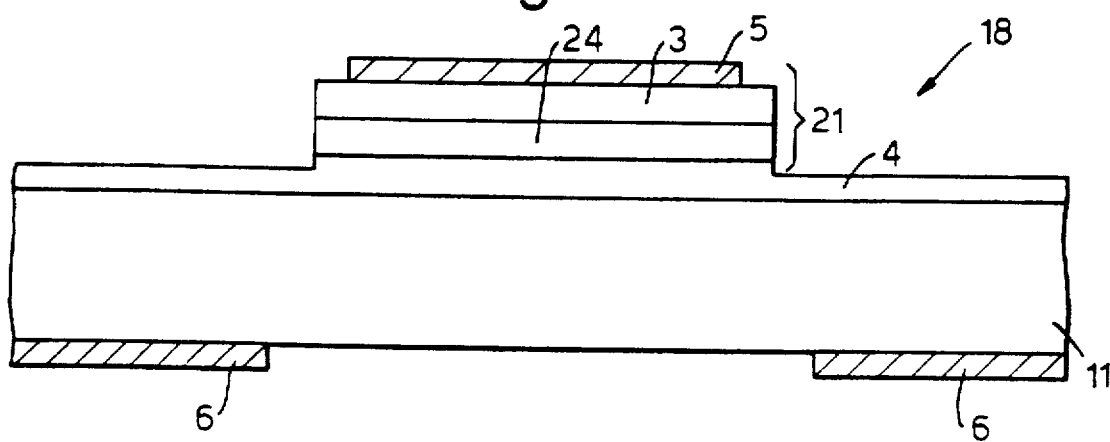

Referring to FIG. 6b, in order to fabricate a device of the current invention 18 a $10^{-4}$ m$\times 10^{-4}$ m square mesa 21 was etched into the epitaxial structure represented by FIG. 6a and a Ti/Au contact 5, slightly smaller than the mesa, was deposited on top. A NiGeAu contact 6 was deposited on the substrate 11 and had a $5 \times 10^{-4}$ m diameter hole centred on the mesa 21 in order to allow light to exit the device. A lens (not shown) may be fitted to substrate 11 in order to improve the performance of the LED in an optical system.

Figure 6C:
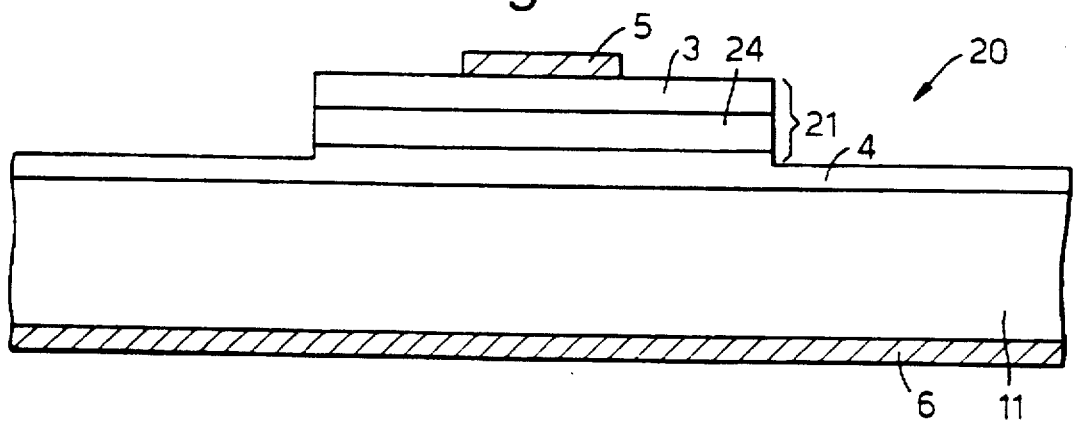

Referring to FIG. 6c, a front emission device 20 similar to that found in the prior art was fabricated, for comparison purposes, from the same basic layer structure represented by FIG. 6a. The device was fabricated by depositing a $50 \times 10^{-6}$ m diameter TiAu contact 5 on top of the layer structure and etching a $2 \times 10^{-4}$ m mesa 21 around the contact. A metal contact 6 of NiGeAu was deposited on the bottom of the substrate.

Figure 7:
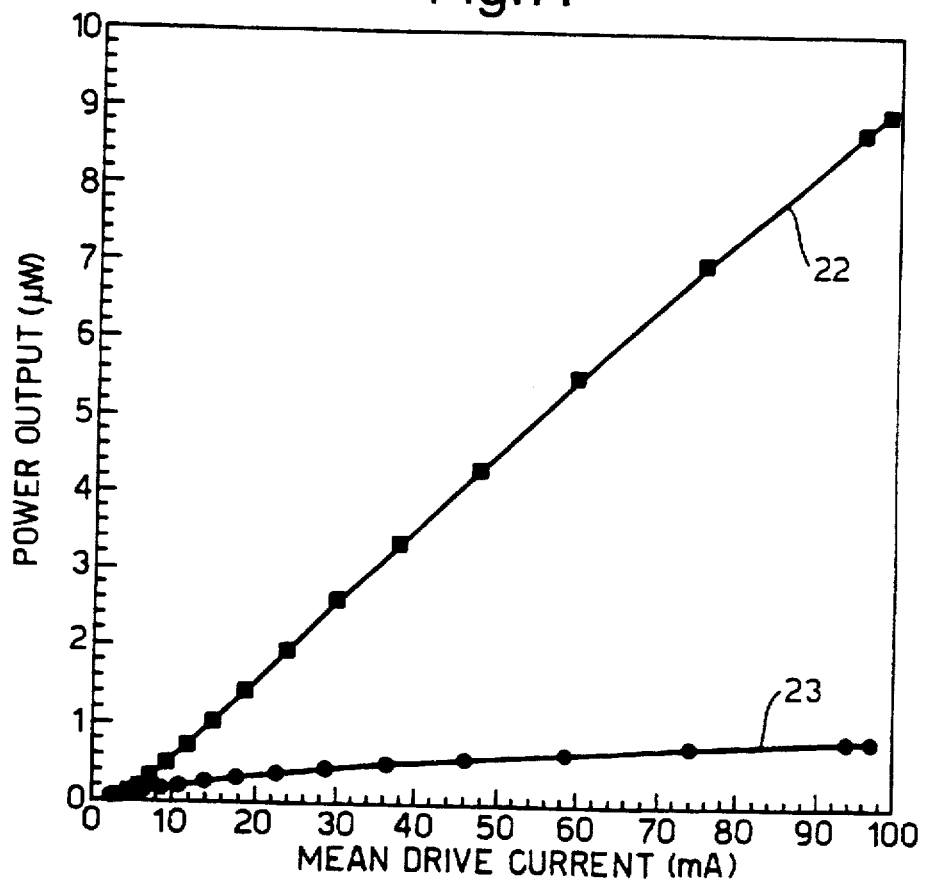
FIG. 7 shows a comparison between the plots of output intensity versus drive current for the devices represented by FIGS. 6b and 6c.

Referring to FIG. 7, comparison of the plots of output intensity versus drive current for the device of the current invention 22 (as represented in FIG. 6b) and of the prior art 23 (as represented in FIG. 6c) show that, for a given drive current, the mean power output is up to about nine times greater for the device of the current invention.

We claim:

1. A light emitting diode for producing radiation in the wavelength range $2.5 \times 10^{-6}$ to $5 \times 10^{-6}$ m comprising:

a substrate of n-type InAs, a layer of n-type InAs located on said substrate; and a layer of p-type InAs, wherein the substrate is sufficiently doped so that it is substantially transparent to radiation produced by the diode by virtue of a Moss-Burstein shift.

2. The light emitting diode of claim 1 where the substrate material is doped to within the range $10^{18}$ cm$^{-3}$ to $5 \times 10^{18}$ cm$^{-3}$.

3. The light emitting diode of claim 1 where the substrate material is doped to within the range $3 \times 10^{18}$ cm$^{-3}$ to $5 \times 10^{18}$ cm$^{-3}$.

4. The light emitting diode of claim 1 where the layer of n-type InAs is doped to a level of $5 \times 10^{17}$ cm$^{-3}$ and the layer of p-type InAs is doped to a level of $5 \times 10^{18}$ cm$^{-3}$.

5. The light emitting diode of claim 1 where the layer of n-type InAs is doped to a level of $10^{18}$ cm$^{-3}$ the layer of p-type InAs is doped to a level of $5 \times 10^{18}$ cm$^{-3}$ and further comprising a layer of undoped InAs.

6. The light emitting diode of claim 1 where the transparent substrate is formed into a lens.

7. A method of producing a light emitting diode capable of radiation in the wavelength range of $2.5 \times 10^{-6}$ to $5 \times 10^{-6}$ m, said method comprising the steps of providing a substrate of n-type InAs;

doping said substrate with at least one dopant at at least one dopant concentration such that the substrate is substantially transparent to radiation produced in the wavelength range;

locating a layer of n-type InAs on said substrate; and locating a layer of p-type InAs on said layer of n-type InAs.

8. A method of producing radiation in the wavelength range of $2.5 \times 10^{-6}$ to $5 \times 10^{-6}$ m, said method comprising the steps of providing a substrate of n-type InAs;

doping said substrate with at least one dopant at at least one dopant concentration such that the substrate is substantially transparent to radiation produced in the wavelength range;

locating a layer of n-type InAs on said substrate;

locating a layer of p-type InAs on said layer of n-type InAs; and applying a electrical bias between said substrate and said p-type InAs layer.

9. A light emitting diode for producing radiation in the wavelength range $2.5 \times 10^{-6}$ to $5 \times 10^{-6}$ m, said diode comprising:

a substrate of highly doped n-type InAs, wherein the substrate is sufficiently doped so that it is substantially transparent to radiation produced by the diode by virtue of a Moss-Burstein shift;

a layer of n-type InAs on said substrate;

a layer of p-type InAs on said n-type InAs layer;

a metallic layer over said p-type InAs layer;

an insulation layer separating said p-type InAs layer from said metallic layer at all areas except a window area of contact between said metallic layer and said p-type InAs layer; and an electrical contact on said substrate remote from said window area.

10. A light emitting diode for producing radiation in the wavelength range $2.5 \times 10^{-6}$ to $5 \times 10^{-6}$ m, said diode comprising:

a substrate of n-type InAs having upper and lower surfaces and a hole therethrough at a location through which said radiation is to radiate;

a contact comprising a metallic layer on the lower surface of said n-type InAs substrate;

a highly doped substrate of n-type InAs on the upper surface of said n-type InAs substrate, wherein the substrate is sufficiently doped so that it is substantially transparent to radiation produced by the diode by virtue of a Moss-Burstein shift;

a layer of n-type InAs, having a dopant concentration less than said highly doped substrate, on said highly doped substrate of n-type InAs;

a layer of p-type InAs on said n-type InAs layer; and a metallic layer on said p-type InAs layer and located over said hole.

11. The light emitting diode of claim 10 wherein said n-type InAs dopant is sulphur.

12. The light emitting diode of claim 10 wherein said p-type InAs dopant is zinc.

13. The light emitting diode of claim 10 wherein said substrate of n-type InAs having a hole is doped to a concentration of about $5 \times 10^{16}$ cm$^{-3}$.

14. The light emitting diode of claim 10 wherein said substrate of heavily doped n-type InAs is doped to a concentration of about $4 \times 10^{18}$ cm$^{-3}$.

15. The light emitting diode of claim 10 wherein said layer of n-type InAs is doped to a concentration of about $5 \times 10^{17}$ cm$^{-3}$.

16. The light emitting diode of claim 10 wherein said layer of p-type InAs having a hole is doped to a concentration of about $5 \times 10^{18}$ cm$^{-3}$.

17. A light emitting diode for producing radiation in the wavelength range $2.5 \times 10^{-6}$ to $5 \times 10^{-6}$ m, said diode comprising:

a highly doped substrate of n-type InAs, wherein the substrate is sufficiently doped so that it is substantially transparent to radiation produced by the diode by virtue of a Moss-Burstein shift;

a metallic contact located on a lower surface of said substrate, said contact having a hole therein at a location through which said radiation is to radiate;

a layer of n-type InAs, having a dopant concentration less than said highly doped substrate, on said highly doped substrate of n-type InAs;

a layer of undoped InAs on said layer of n-type InAs;

a layer of p-type InAs on said n-type InAs layer; and a metallic layer on said p-type InAs layer and located over said hole.

18. The light emitting diode of claim 17 wherein said n-type InAs dopant is sulphur.

19. The light emitting diode of claim 17 wherein said p-type InAs dopant is zinc.

20. The light emitting diode of claim 17 wherein said substrate of highly doped n-type InAs is doped to a concentration of about $2 \times 10^{18}$ cm$^{-3}$.

21. The light emitting diode of claim 17 wherein said layer of n-type InAs is doped to a concentration of about $10^{18}$ cm$^{-3}$.

22. The light emitting diode of claim 17 wherein said layer of p-type InAs is doped to a concentration of about $5 \times 10^{18}$ cm$^{-3}$.

* * * * *